(12) United States Patent
Li

(10) Patent No.: US 12,038,645 B2
(45) Date of Patent: Jul. 16, 2024

(54) LIGHT-EMITTING SUBSTRATE AND DISPLAY DEVICE

(71) Applicant: Shenzhen China Star Optoelectronics Semiconductor Display Technology Co., Ltd., Guangdong (CN)

(72) Inventor: Yanchen Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,376

(22) PCT Filed: Aug. 27, 2021

(86) PCT No.: PCT/CN2021/115056
§ 371 (c)(1),
(2) Date: Sep. 30, 2021

(87) PCT Pub. No.: WO2023/019630
PCT Pub. Date: Feb. 23, 2023

(65) Prior Publication Data
US 2024/0045269 A1   Feb. 8, 2024

(30) Foreign Application Priority Data
Aug. 19, 2021   (CN) .......................... 202110954245.8

(51) Int. Cl.
G02F 1/1335      (2006.01)
G02F 1/13357     (2006.01)

(52) U.S. Cl.
CPC .. *G02F 1/133612* (2021.01); *G02F 1/133603* (2013.01); *G02F 1/133606* (2013.01)

(58) Field of Classification Search
CPC ......... G02F 1/133612; G02F 1/133603; G02F 1/133606
See application file for complete search history.

(56) References Cited

U.S. PATENT DOCUMENTS

| | | | |
|---|---|---|---|
| 2009/0219460 A1 | 9/2009 | Takeda et al. | |
| 2010/0208164 A1 | 8/2010 | Ohashi et al. | |
| 2012/0229035 A1* | 9/2012 | Wang | H05B 45/00 315/192 |

FOREIGN PATENT DOCUMENTS

| | | |
|---|---|---|
| CN | 1585142 | 2/2005 |
| CN | 102307412 | 1/2012 |
| CN | 202432350 | 9/2012 |
| CN | 102788331 | 11/2012 |
| CN | 105023522 | 11/2015 |
| CN | 107390428 | 11/2017 |
| CN | 209728079 | 12/2019 |
| CN | 110797452 | 2/2020 |

(Continued)

*Primary Examiner* — Anne M Hines
*Assistant Examiner* — Jose M Diaz

(57) ABSTRACT

A light-emitting substrate and a display device are provided. The light-emitting substrate includes a plurality of partitions, and the partitions include a first light-emitting unit and a first dummy unit. The first light-emitting unit includes at least one light-emitting element. The first dummy unit is connected in parallel with the first light-emitting unit. The first dummy unit includes a dummy light-emitting element, and an operating voltage of the first dummy unit is greater than an operating voltage of the first light-emitting unit.

20 Claims, 11 Drawing Sheets

(56) References Cited

FOREIGN PATENT DOCUMENTS

| CN | 111462622 | 7/2020 |
| CN | 111798803 | 10/2020 |
| CN | 212628476 | 2/2021 |
| JP | 2007-165161 | 6/2007 |
| WO | WO 2013/063996 | 5/2013 |

* cited by examiner

LIGHT-EMITTING SUBSTRATE AND DISPLAY DEVICE

RELATED APPLICATIONS

This application is a National Phase of PCT Patent Application No. PCT/CN2021/115056 having International filing date of Aug. 27, 2021, which claims the benefit of priority of Chinese Patent Application No. 202110954245.8 filed on Aug. 19, 2021. The contents of the above applications are all incorporated by reference as if fully set forth herein in their entirety.

FIELD AND BACKGROUND OF THE INVENTION

The present application relates to the field of display technologies, and more particularly to a light-emitting substrate and a display device.

Mini-LED (sub-millimeter light-emitting diode) and Micro-LED (micro-light-emitting diode) (hereinafter collectively referred to as mLED) display technology has advantages of high brightness, high contrast, and long service life. mLED can not only be used as a direct backlight to achieve HDR function, but also as a display to achieve many functions such as direct display, transparent display, and flexible display.

A known mLED light-emitting substrate is usually provided with M rows and N columns of partitions. In order to improve brightness and uniformity of each partition, more than two light-emitting elements are arranged in each partition. Two or more light-emitting elements in each partition may be connected in series, parallel or series-parallel. Refer to FIG. 1A, when four light-emitting elements LED1, LED2, LED3, and LED4 in each partition are connected in series, if one light-emitting element 1 in the partition is broken, an entire partition cannot emit light, that is, dark light. Please refer to FIG. 1B, suppose a voltage applied across four light-emitting elements in each partition is 2U, and U is an operating voltage of LED1 to LED4. Under normal operating conditions, operating voltages of LED1 to LED4 are all U. When the four light-emitting elements in each partition are connected in series and parallel, if LED1 is disconnected, LED2, LED3, and LED4 can still emit light. However, an LED1 open circuit causes a loss of single-partition brightness. In the above connection mode, when one light-emitting element is disconnected, a luminous brightness of a single partition will be reduced, which will seriously affect a picture display quality of a whole machine.

SUMMARY OF THE INVENTION

In view of this, the purpose of the present application is to provide a light-emitting substrate and a display device, which can prevent dark lights or loss of brightness caused when a light-emitting element in a single partition is disconnected.

The present application provides a light-emitting substrate comprising a plurality of partitions, wherein the partitions comprise a first light-emitting unit comprising at least one light-emitting element, and a first dummy unit connected in parallel with the first light-emitting unit, wherein the first dummy unit comprises a dummy light-emitting element, and an operating voltage of the first dummy unit is greater than an operating voltage of the first light-emitting unit.

In an embodiment, the operating voltage of the first dummy unit is 105% to 150% of the operating voltage of the first light-emitting unit.

In an embodiment, the operating voltage of the first dummy unit is 105% to 130% of the operating voltage of the first light-emitting unit.

In an embodiment, the light-emitting substrate further comprises an optical film, and the optical film is disposed on a light-emitting side of the first light-emitting unit and the first dummy unit.

In an embodiment, the first light-emitting unit comprises two or more light-emitting elements, and two or more of the light-emitting elements are arranged in series, in parallel, or in a combination of series and parallel.

In an embodiment, the first light-emitting unit and the first dummy unit are integrated in a same chip.

In an embodiment, the partition further comprises a second light-emitting unit connected in series with the first light-emitting unit, wherein the second light-emitting unit comprises at least one light-emitting element, and a second dummy unit connected in parallel with the second light-emitting unit, wherein an operating voltage of the second dummy unit is greater than an operating voltage of the second light-emitting unit.

In an embodiment, the second dummy unit comprises a dummy light-emitting element and/or a Zener diode.

In an embodiment, the first dummy unit and the second dummy unit are composed of light-emitting elements, and the light-emitting elements in the first light-emitting unit, the second light-emitting unit, the first dummy unit, and the second dummy unit are the same device.

In an embodiment, the first dummy unit further comprises a Zener diode, and the Zener diode is connected in series or in parallel with the dummy light-emitting element.

In an embodiment, an operating voltage of the Zener diode is greater than the operating voltage of the dummy light-emitting element.

The present application provides a display device, which comprises the light-emitting substrate as described in any one of the above.

In an embodiment, the display device is a liquid crystal display device or a self-luminous display device.

Beneficial effect: At least one partition of a light-emitting substrate of the present application is provided with a first light-emitting unit and a first dummy unit connected in parallel, and the first dummy unit includes a dummy light-emitting element. When the light-emitting element in the first light-emitting unit fails, causing the first light-emitting unit to be disconnected, a voltage across the first light-emitting unit and the first dummy unit rises. When the voltage across the first light-emitting unit and the first dummy unit rises to an operating voltage of the first dummy unit, the dummy light-emitting element is turned on, instead of the light-emitting element that is disconnected in the first light-emitting unit, emits light and conducts the circuit, thereby preventing dark lights or loss of brightness caused when the light-emitting element in a single partition is disconnected.

BRIEF DESCRIPTION OF THE SEVERAL VIEWS OF THE DRAWINGS

In order to explain the technical solution in the present application more clearly, the following will briefly introduce the drawings that need to be used in the description of the embodiments. Obviously, the drawings in the following description are only some embodiments of the present application. For those skilled in the art, other drawings can be obtained based on these drawings without creative work.

DESCRIPTION OF SPECIFIC EMBODIMENTS OF THE INVENTION

Figure 1A:
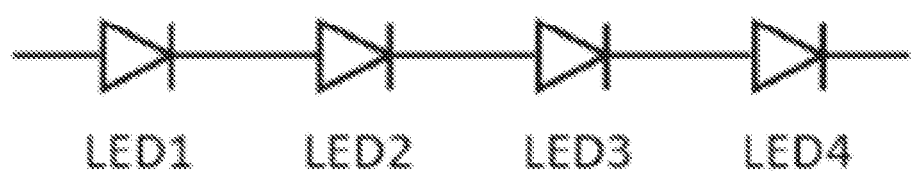
FIG. 1A is a circuit diagram of a light-emitting element in a light-emitting substrate in the prior art.

The technical solutions in this application will be clearly and completely described below in conjunction with the drawings in the embodiments of the present application. Obviously, the described implementation manners are only a part of the implementation manners of the present application, rather than all of the implementation manners. Based on the implementation manners in the present application, all other implementation manners obtained by those skilled in the art without creative work shall fall within the protection scope of the present application.

In the present application, unless expressly stipulated and defined otherwise, a first feature "above" or "below" a second feature may include a direct connection of the first and second features. It can also be included that the first and second features are not directly connected but in contact with another feature between them. The first feature "above", "on", and "on top of" of the second feature includes the first feature directly above and obliquely above the second feature, or it simply means that the first feature is higher in level than the second feature. The first feature "below", "under" and "underneath" the second feature includes the first feature directly below and obliquely below the second feature, or it simply means that the level of the first feature is smaller than the second feature.

The present application provides a light-emitting substrate. The light-emitting substrate can be used as a backlight source of a liquid crystal display (LCD) and can also be used for self-luminous display.

The light-emitting substrate includes a plurality of partitions, and the partitions include a first light-emitting unit and a first dummy unit. The first light-emitting unit includes at least one light emitting element. The first dummy unit is connected in parallel with the first light-emitting unit. The first dummy unit includes a dummy light-emitting element, and an operating voltage of the first dummy unit is greater than an operating voltage of the first light-emitting unit. Compared with the light-emitting substrate in the prior art, each partition of the light-emitting substrate of the present application is provided with a first light-emitting unit and a first dummy unit connected in parallel, and the first dummy unit includes a dummy light-emitting element. When the light-emitting substrate works, a voltage is applied to each partition, and a voltage across the first light-emitting unit and the first dummy unit is controlled to be greater than or equal to the operating voltage of the first light-emitting unit and less than the operating voltage of the first dummy unit. When the light-emitting element in the first light-emitting unit works normally, the first dummy unit does not work. When the light-emitting element in the first light-emitting unit fails, causing the first light-emitting unit to be disconnected, the voltage across the first light-emitting unit and the first dummy unit rises. When the voltage across the first light-emitting unit and the first dummy unit rises to the operating voltage of the first dummy unit, the dummy light-emitting element is turned on, instead of the light-emitting element that is disconnected in the first light-emitting unit, emits light and turns on the circuit, so as to prevent a dark light or brightness loss caused by an open circuit of the light-emitting element in a single partition.

Hereinafter, specific implementations of the present application will be described with reference to the drawings.

Figure 2:
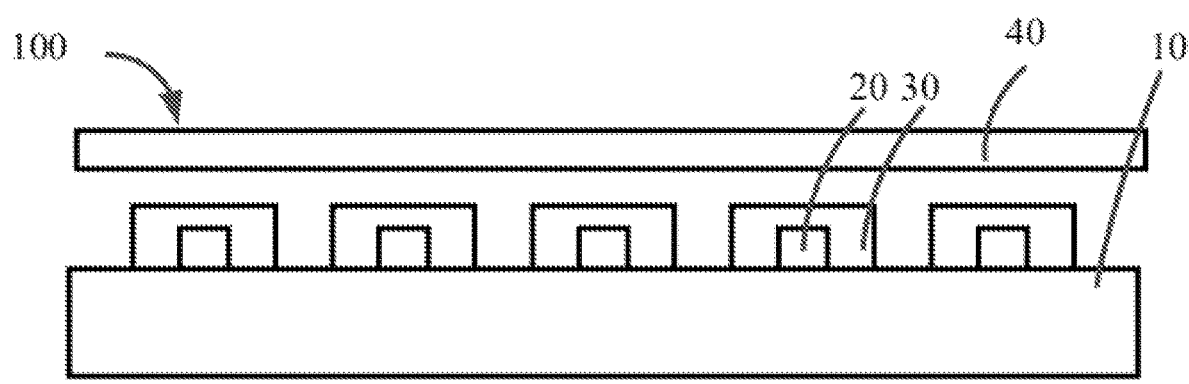
FIG. 2 is a schematic side view of a light-emitting substrate according to an embodiment of the present application.
Figure 3:
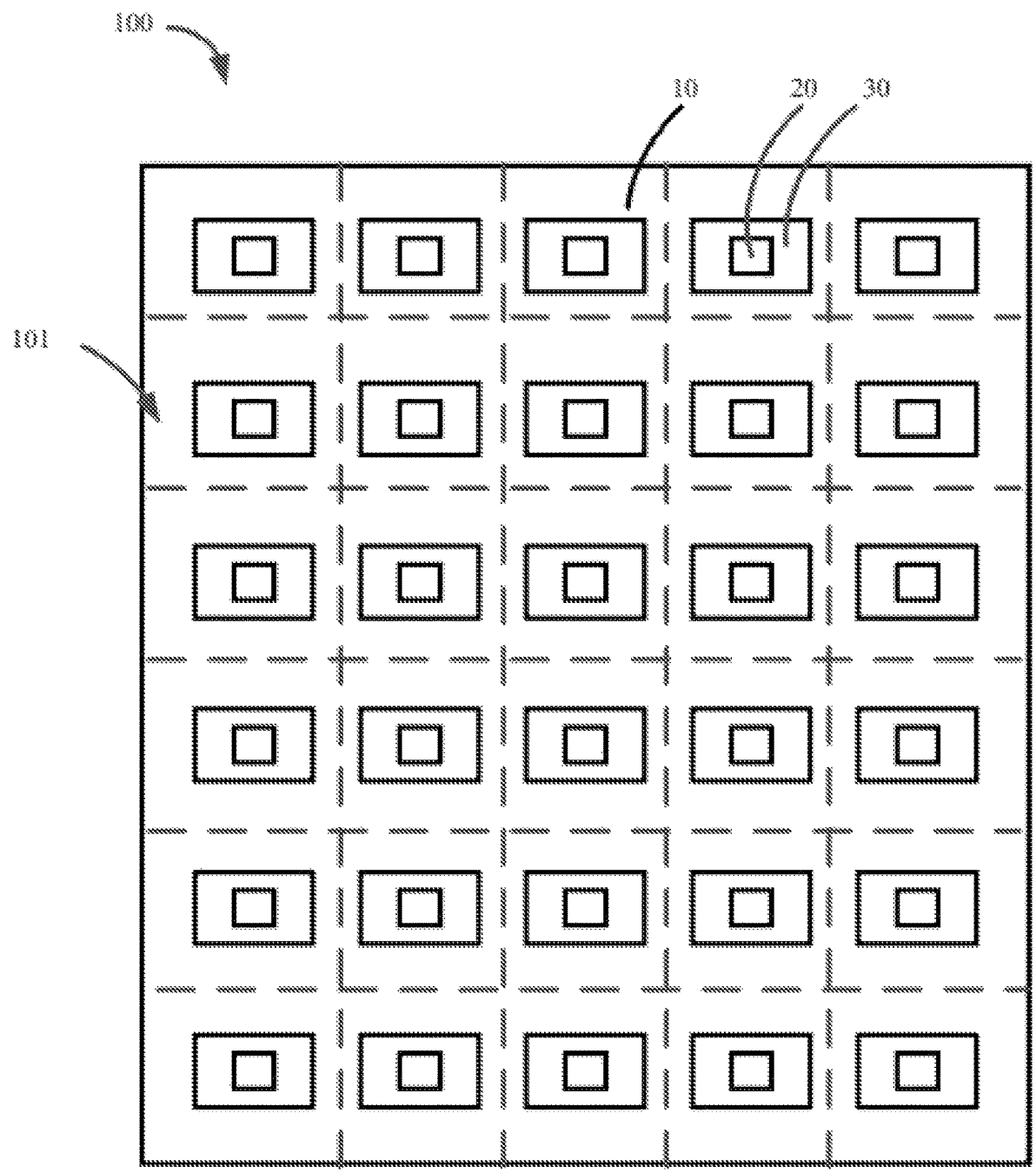
FIG. 3 is a schematic top view of the light-emitting substrate of FIG. 2.

Refer to FIG. 2 and FIG. 3, the light-emitting substrate 100 includes a substrate 10, a plurality of light-emitting elements 20 and a plurality of packages 30. The substrate 10 may be a glass substrate or a plastic substrate. A plurality of light emitting elements 20 are provided on the substrate 10. The plurality of packages 30 are arranged on a side of the plurality of light-emitting elements 20 away from the substrate 10. Each package 30 encapsulates a light emitting element 20. The light-emitting substrate 100 may further include an optical film 40. The optical film 40 is disposed on a side of the package 30 away from the substrate 10, that is, a light-emitting side of the light-emitting element 20. The optical film 40 may include a reflective sheet, a light guide plate, a diffusion sheet, a brightness enhancement sheet, and the like.

The light-emitting substrate 100 includes a plurality of partitions 101. Optionally, the multiple partitions 101 are arranged in a matrix. It can be understood that the multiple partitions 101 may also be arranged in other ways. When the light-emitting substrate 100 is a backlight module of a liquid crystal display device, each partition 101 corresponds to one or more sub-pixels of the liquid crystal display panel. When the light-emitting substrate 100 is a self-luminous display device, each partition 101 is a sub-pixel. Each partition 101 is provided with a light emitting element 20 and a package 30.

Figure 4:
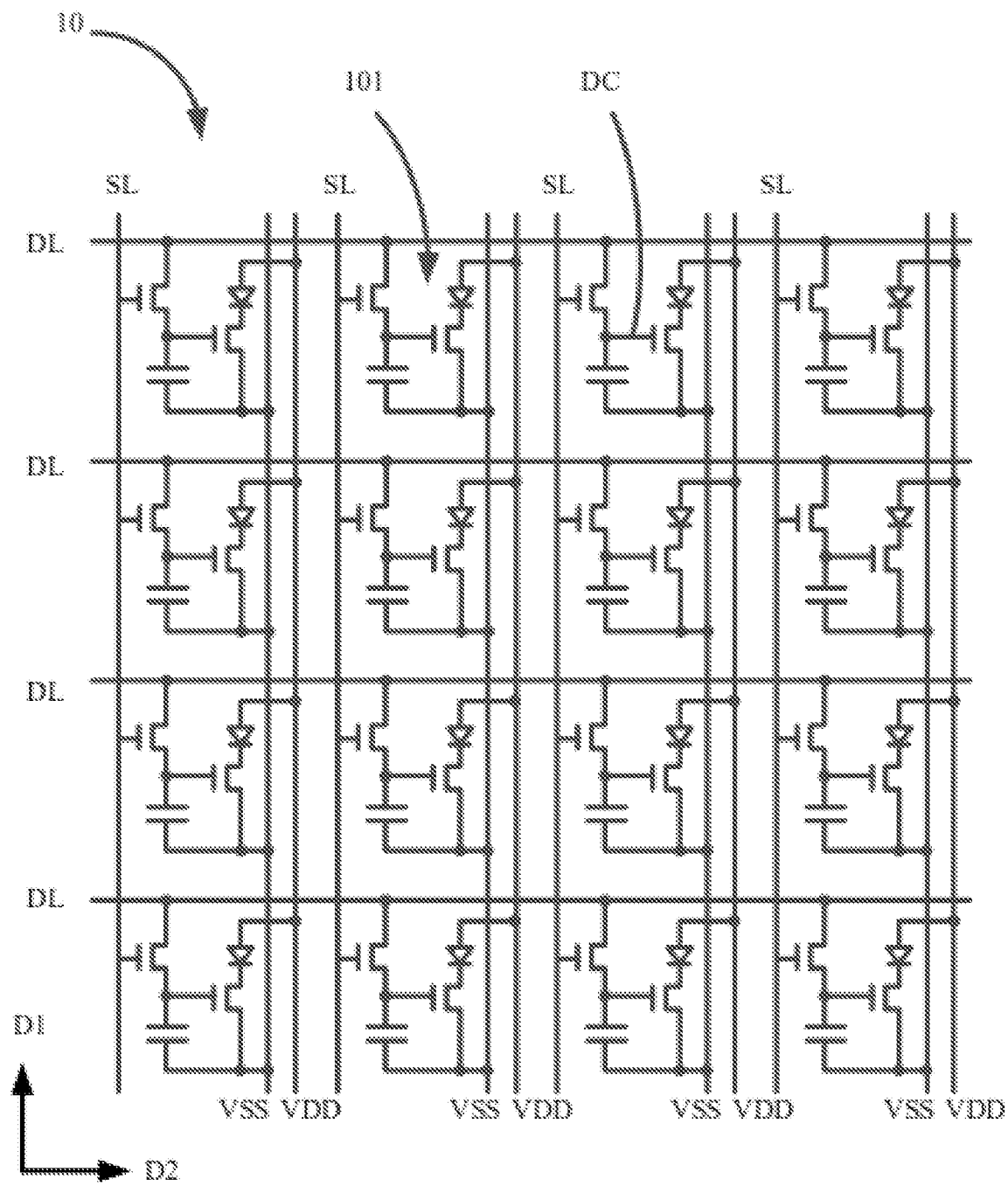
FIG. 4 is a schematic diagram of a structure of a driving circuit of a light-emitting substrate according to an embodiment of the present application.

Refer to FIG. 4, a driving circuit DC for driving the light-emitting element 20 to emit light is provided on the substrate 10. Specifically, a plurality of scan lines SL and a plurality of data lines DL are provided on the substrate 10. The multiple scan lines extend along the first direction D1 and are arranged along the second direction D2. The plurality of data lines DL extend along the second direction D2 and are arranged along the first direction D1. The first direction D1 intersects the second direction D2. Optionally, the first direction D1 may be perpendicular to the second direction D2. The intersection of a plurality of scan lines SL and a plurality of data lines DL defines a plurality of partitions 101. The light emitting substrate 100 further includes a plurality of VDD signal lines and a plurality of VSS signal lines. The plurality of VDD signal lines and the plurality of VSS signal lines respectively extend along the first direction D1 and are arranged along the second direction D2. A VDD signal line and a VSS signal line are provided between two adjacent scan lines SL. Optionally, each VSS signal line may be located between a VDD signal line and a scan line SL.

The light-emitting substrate 100 may be an active matrix light-emitting substrate. The light-emitting substrate 100 may be driven by a constant voltage driving method. Specifically, it refers to a constant voltage between VDD and VSS, that is, a voltage across the light-emitting element 20 is constant. The light-emitting substrate 100 may include a constant voltage driving source (not shown). The driving circuit DC is connected to a constant voltage source.

Figure 5:
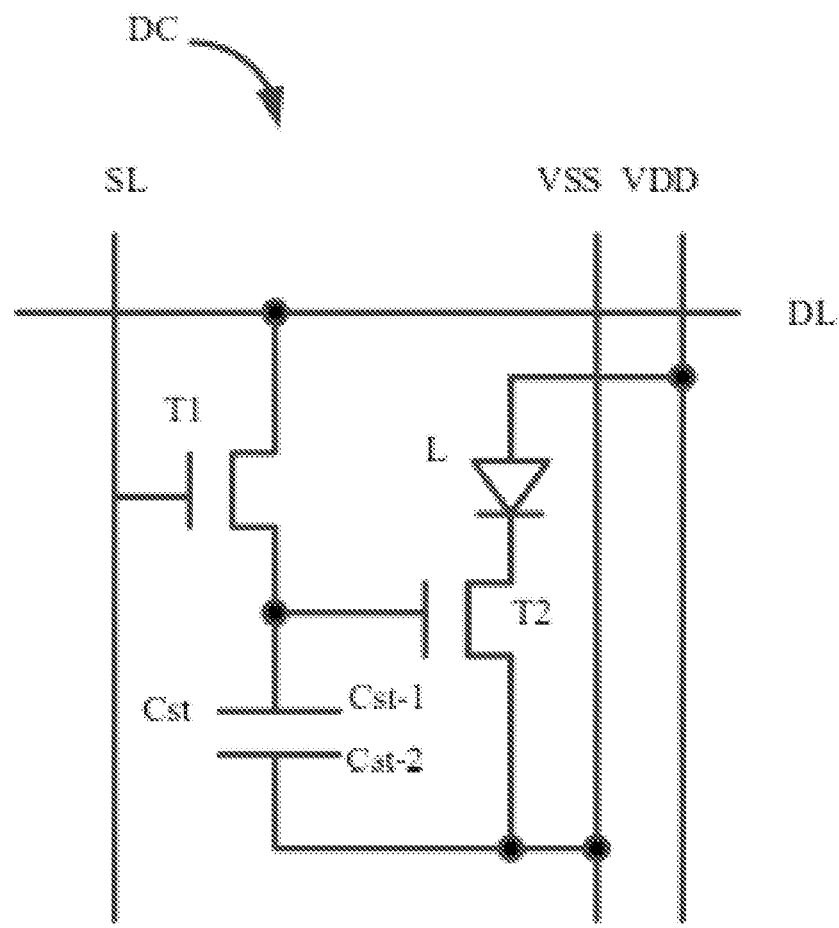
FIG. 5 is a circuit diagram of a drive circuit of one partition of the light-emitting substrate of FIG. 4.

Refer to FIG. 5, each partition 101 includes a driving circuit DC. The driving circuit DC may be a driving circuit DC commonly used in the art such as 2T1C, 1TFT 1MOS 1C, 3T1C, 5T1C, or 7T1C. Optionally, the driving circuit DC of this embodiment is a 2T1C circuit. The driving circuit DC includes a switching transistor T1, a driving transistor T2, a storage capacitor Cst, and a light-emitting element 20. A gate of the switching transistor T1 is connected to the scan line SL, a source is connected to the data line DL, and a drain is connected to a first plate of the storage capacitor Cst. The first plate Cst-1 of the storage capacitor Cst is connected to the drain of the switching transistor T1, and a second plate is connected to the VSS signal line. The gate of the driving transistor T2 is connected between the drain of the switching transistor T1 and the first plate Cst-1 of the storage capacitor Cst, the source is connected to the cathode of the light-emitting element 20, and the drain is connected between the second plate Cst-2 of the storage capacitor Cst and the VSS signal line. The anode of the light-emitting element 20 is connected to the VDD signal line, and the cathode is connected to the source of the driving transistor T2.

The scan line SL is scanned column by column to realize active matrix driving. The light-emitting element 20 is driven in a constant voltage mode and working phases of the light-emitting element 20 include a data writing phase and a light-emitting phase. In the data writing stage, the scan signal Scan is at a high potential, and the scan signal Scan controls the switching transistor T1 to turn on, and the data signal Data is input to the gate of the driving transistor T2 and stored in the storage capacitor Cst. Then, the driving transistor T2 is turned on, and the current flows from the VDD signal line into the light emitting element 20 and the driving transistor T2, and finally flows out from the VSS signal line, so that the light-emitting element 20 emits light. In the light-emitting phase, the scan signal Scan is at a low level, and the switching transistor T1 is turned off. The storage capacitor Cst can maintain the gate potential of the driving transistor T2, so that the light-emitting device continues to emit light.

It can be understood that, in this embodiment, all the partitions 101 of the light-emitting substrate 100 include the above-mentioned structure as an example for description. In other embodiments, it is only necessary that at least one subarea 101 of the light-emitting substrate 100 includes the above-mentioned structure.

Figure 6:
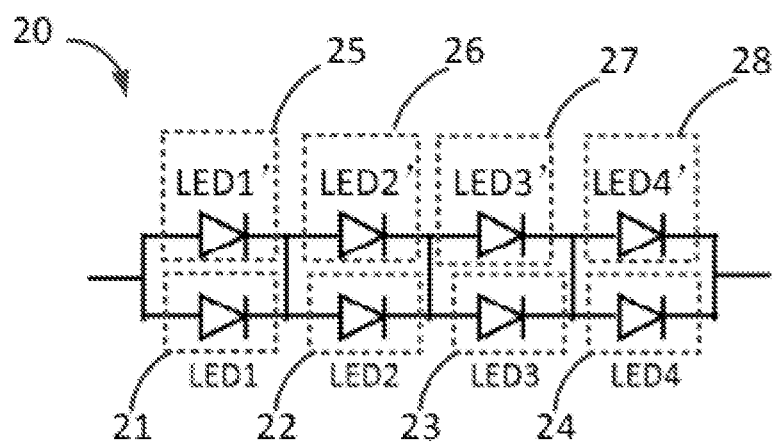
FIG. 6 is a circuit diagram of a light-emitting element of a light-emitting substrate according to a first embodiment of the present application.

Refer to FIG. 6, the light-emitting element 20 includes a first light-emitting unit 21, a second light-emitting unit 22, a third light-emitting unit 23, a fourth light-emitting unit 24, a first dummy unit 25, a second dummy unit 26, a third dummy unit 27, and a fourth dummy unit 28. The first light-emitting unit 21, the second light-emitting unit 22, the third light-emitting unit 23, and the fourth light-emitting unit 24 are sequentially connected in series. The first dummy unit 25 is connected in parallel with the first light-emitting unit 21. The second dummy unit 26 is connected in parallel with the second light-emitting unit 22. The third dummy unit 27 and the third light emitting unit 23 are connected in parallel. The fourth dummy unit 28 is connected in parallel with the fourth light-emitting unit 24. It can be understood that, in this embodiment, the light-emitting element 20 includes four light-emitting units and four spare elements as an example for description. However, the number of light-emitting units and spare elements included in the light-emitting element 20 of the present application is not limited to this.

The first light-emitting unit 21, the second light-emitting unit 22, the third light-emitting unit 23, and the fourth light-emitting unit 24 each include at least one light-emitting element. Specifically, the first light-emitting unit 21 includes a first light-emitting element LED1. The second light emitting unit 22 includes a second light emitting element LED2. The third light-emitting unit 23 includes a third light-emitting element LED3. The fourth light-emitting unit 24 includes a fourth light-emitting element LED4. In this embodiment, the first light-emitting unit 21, the second light-emitting unit 22, the third light-emitting unit 23, and the fourth light-emitting unit 24 each include one light-emitting element as an example for description. It can be understood that the number of light-emitting elements included in the light-emitting unit of the present application is not limited to this. Optionally, the number of light-emitting elements included in the first light-emitting unit 21, the second light-emitting unit 22, the third light-emitting unit 23, and the fourth light-emitting unit 24 may or may not be the same.

The light-emitting element can be Micro-LED or Mini-LED. It can be understood that the light-emitting elements of the present application are not limited to Micro-LEDs or Mini-LEDs and may also be LEDs or other light-emitting elements. Optionally, the types of light-emitting elements in the first light-emitting unit 21, the second light-emitting unit 22, the third light-emitting unit 23, and the fourth light-emitting unit 24 are the same. In this embodiment, the first light-emitting element LED1 to the fourth light-emitting element LED4 are all Mini-LEDs.

The operating voltage of the first dummy unit 25 is greater than the operating voltage of the first light-emitting unit 21, so that when the light-emitting substrate 100 works normally, the first light-emitting unit 21 is turned on, but the first dummy unit 25 is not. Optionally, the operating voltage of the first dummy unit 25 may be 105% to 150% of the operating voltage of the first light-emitting unit 21. When the operating voltage of the first dummy unit 25 is 105% to 150% of the operating voltage of the first light-emitting unit 21, it can be used in conjunction with the optical film 40 to obtain a more uniform light-emitting effect.

Further, in order to prevent the operating voltage difference between the first dummy unit 25 and the first light-emitting unit 21 from being too large, resulting in an excessively large voltage division after the first dummy unit 25 is turned on, and a partial pressure of other light-emitting units connected in series with the first light-emitting unit 21 is drastically reduced, which causes an excessive change in the brightness of the light-emitting element 20. The operating voltage of the first dummy unit 25 may be close to the operating voltage of the first light-emitting unit 21. Specifically, the operating voltage of the first dummy unit 25 may be 105% to 130% of the operating voltage of the first light-emitting unit 21. Furthermore, the operating voltage of the first dummy unit 25 is 105% to 120% of the operating voltage of the first light-emitting unit 21.

The first dummy unit 25 includes a dummy light emitting element. The dummy light-emitting element may be the same device as the light-emitting element in the first light-emitting unit 21. Specifically, it may be Micro-LED or Mini-LED. As shown in FIG. 2, the first dummy unit 25 and the first light-emitting unit 21 can be integrated in the same chip and packaged in the same package 30, and then connected to the driving circuit DC in the partition 101. The first dummy unit 25 and the first light-emitting unit 21 may be stacked on the substrate 10 and packaged in the same package 30. As a result, a manufacturing process can be simplified, and space occupied by the first dummy unit 25 and the first light-emitting unit 21 can be saved. As the space occupied by the first dummy unit 25 and the first light-emitting unit 21 is reduced, an area of the white oil used to reflect light on the substrate 10 is increased, which is beneficial to improve a brightness of the light-emitting substrate 100. In other embodiments of the present application, the first dummy unit 25 and the first light-emitting unit 21 in the light-emitting element 20 may also be separately disposed on the substrate 10 and packaged in different packages 30 respectively. Specifically, the first dummy unit 25 is directly formed in the driving circuit DC, and then connected in parallel with the first light-emitting unit 21.

The operating voltage of the second dummy unit 26 is greater than the operating voltage of the second light-emitting unit 22, so that when the light-emitting substrate 100 is working normally, the second light-emitting unit 22 is turned on, and the second dummy unit 26 is not turned on. Optionally, the operating voltage of the second dummy unit 26 may be 105% to 150% of the operating voltage of the second light-emitting unit 22. Further, in order to prevent the operating voltage difference between the second dummy unit 26 and the second light-emitting unit 22 from being too large, the voltage division of the second dummy unit 26 after the second dummy unit 26 is turned on is too large. The operating voltage of the second dummy unit 26 may be close to the operating voltage of the second light-emitting unit 22. Specifically, the operating voltage of the second dummy unit 26 may be 105% to 130% of the operating voltage of the second light-emitting unit 22. Furthermore, the operating voltage of the second dummy unit 26 is 105% to 120% of the operating voltage of the second light-emitting unit 22. The second dummy unit 26 includes a dummy light-emitting element. The dummy light-emitting element may be the same device as the light-emitting element in the second light-emitting unit 22.

The operating voltage of the third dummy unit 27 is greater than the operating voltage of the third light-emitting unit 23, so that when the light-emitting substrate 100 works normally, the third light-emitting unit 23 is turned on, and the third dummy unit 27 is not turned on. Optionally, the operating voltage of the third dummy unit 27 may be 105% to 150% of the operating voltage of the third light-emitting unit 23. Further, in order to prevent the operating voltage difference between the third dummy unit 27 and the third light-emitting unit 23 from being too large, the voltage division of the third dummy unit 27 after being turned on is too large. The operating voltage of the third dummy unit 27 may be close to the operating voltage of the third light-emitting unit 23. Specifically, the operating voltage of the third dummy unit 27 may be 105% to 130% of the operating voltage of the third light-emitting unit 23. Furthermore, the operating voltage of the third dummy unit 27 is 105% to 120% of the operating voltage of the third light-emitting unit 23. The third dummy unit 27 includes a dummy light-emitting element. The dummy light-emitting element may be the same device as the light-emitting element in the third light-emitting unit 23.

The operating voltage of the fourth dummy unit 28 is greater than the operating voltage of the fourth light-emitting unit 24, so that when the light-emitting substrate 100 works normally, the fourth light-emitting unit 24 is turned on, and the fourth dummy unit 28 is not. Optionally, the operating voltage of the fourth dummy unit 28 may be 105% to 150% of the operating voltage of the fourth light-emitting unit 24. Further, in order to prevent the operating voltage difference between the fourth dummy unit 28 and the fourth light-emitting unit 24 from being too large, the voltage division of the fourth dummy unit 28 after the fourth dummy unit 28 is turned on is too large. The operating voltage of the fourth dummy unit 28 may be close to the operating voltage of the fourth light-emitting unit 24. Specifically, the operating voltage of the fourth dummy unit 28 may be 105% to 130% of the operating voltage of the fourth light-emitting unit 24. Furthermore, the operating voltage of the fourth dummy unit 28 is 105% to 120% of the operating voltage of the fourth light-emitting unit 24. The fourth dummy unit 28 includes a dummy light-emitting element. The dummy light-emitting element may be the same device as the light-emitting element in the fourth light-emitting unit 24.

Optionally, the light-emitting elements in the first light-emitting unit 21 to the fourth light-emitting unit 24 and the light-emitting elements in the first dummy unit 25 to the fourth dummy unit 28 may be the same. In order to reduce the difficulty of characteristic management of devices with different characteristics, the stability and reliability of the light-emitting substrate 100 are improved. Further, in order to simplify the circuit design difficulty and the characteristic management difficulty, the operating voltages of the first dummy unit 25 to the fourth dummy unit 28 may be approximately the same. Optionally, the operating voltages of the first dummy unit 25 to the fourth dummy unit 28 may be same.

In the light-emitting substrate 100 of the first embodiment of the present application, both ends of the light-emitting element LED1, second light-emitting element LED2, third light-emitting element LED3, fourth light-emitting element LED4 are connected in parallel with the first dummy light-emitting element LED1', the second dummy light-emitting element LED2', the third dummy light-emitting element LED3', and the fourth dummy light-emitting element LED4'. The working principle is as follows:

Assuming that the operating voltages of the first light-emitting element LED1 to the fourth light-emitting element LED4 are all U0, the operating voltages of the first dummy light-emitting element LED1' to the fourth dummy light-emitting element LED4' are U'. When the light-emitting substrate 100 is working normally, the voltage applied to both ends of the light-emitting assembly 20 is 4U0. U' is greater than U0 to ensure that when the first light-emitting element LED1 to the fourth light-emitting element LED4 work normally, the first dummy light-emitting element LED1' to the fourth dummy light-emitting element LED4' are in a high-resistance open circuit state. U' can be close to U0, so as to ensure that when at least one of the first dummy light-emitting element LED1' to the fourth dummy light-emitting element LED4' is working, the partial voltage at both ends of the first light-emitting element LED1 to the fourth light-emitting element LED4 will not change too much. When the first light-emitting element LED1 is disconnected, the voltage across the first light-emitting element LED1 rises. When the voltage across the first light-emitting element LED1 rises to U', the first dummy light-emitting element LED1' connected in parallel with the first light-emitting element LED1 is turned on, replacing the first light-emitting element LED1 to emit light. The voltage across the second light-emitting element LED2, the third light-emitting element LED3, and the fourth light-emitting element LED4 drops to (4U0−U')/3. The second dummy light-emitting element LED2', the third dummy light-emitting element LED3', and the fourth dummy light-emitting element LED4' are still in a high-resistance open circuit state, and this ensures that when the first light-emitting element LED1 is disconnected, current can still flow into the second light-emitting element LED2, the third light-emitting element LED3, and the fourth light-emitting element LED4 through the first dummy light-emitting element LED1'. As a result, it is ensured that when one light-emitting element in the single partition 101 of the light-emitting substrate 100 is disconnected, the three light-emitting elements in the other light-emitting units connected in series with the light-emitting unit that is disconnected can still emit light normally, and the dummy light-emitting element can replace the open-circuit light-emitting element to emit light.

Figure 7:
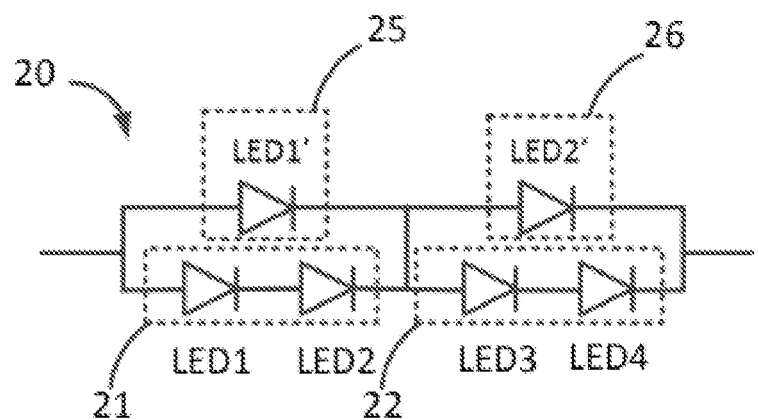
FIG. 7 is a circuit diagram of a light-emitting element of a light-emitting substrate according to a second embodiment of the present application.

Refer to FIG. 7, the light-emitting substrate 100 of the second embodiment of the present application is similar to the first embodiment, and the difference lies in:

The light-emitting assembly 20 includes a first light-emitting unit 21, a second light-emitting unit 22, a first dummy unit 25, and a second dummy unit 26. The first light-emitting unit 21 and the second light-emitting unit 22 are connected in series. The first dummy unit 25 is connected in parallel with the first light-emitting unit 21. The second dummy unit 26 is connected in parallel with the second light-emitting unit 22. The first light-emitting unit 21 includes a first light-emitting element LED1 and a second light-emitting element LED2. The second light-emitting unit 22 includes a third light-emitting element LED3 and a fourth light-emitting element LED4. The first light-emitting element LED1 and the second light-emitting element LED2 in the first light-emitting unit 21 are connected in series. The third light-emitting element LED3 and the fourth light-emitting element LED4 in the second light-emitting unit 22 are also connected in series. The first dummy unit 25 includes a first dummy light-emitting element LED1'. The second dummy unit 26 includes a second dummy light-emitting element LED2'. In the light-emitting substrate 100 of the second embodiment of the present application, the first light-emitting element LED1 and the second light-emitting element LED2 are connected in series, and both ends are connected in parallel with the first dummy light-emitting element LED1'. The third light-emitting element LED3 and the fourth light-emitting element LED4 are connected in series, and the second dummy light-emitting element LED2' is connected in parallel at both ends. The working principle is as follows:

Assuming that the operating voltages of the first light-emitting element LED1 to the fourth light-emitting element LED4 are U0, the operating voltages of the first light-emitting unit 21 and the second light-emitting unit 22 are both 2*U0. The operating voltages of the first dummy light-emitting element LED1' and the second dummy light-emitting element LED2' are both U'. When the light-emitting substrate 100 is working normally, the voltage applied to both ends of the light-emitting element 20 is 4U0. U' is greater than 2*U0 to ensure that when the first light-emitting element LED1 to the fourth light-emitting element LED4 work normally, the first dummy light-emitting element LED1' and the second dummy light-emitting element LED2' are in a high-resistance open circuit state. U' can be close to 2*U0, so as to ensure that when at least one of the first dummy light-emitting element LED1' and the second dummy light-emitting element LED2' is working, the partial voltage at both ends of the first light-emitting element LED1 to the fourth light-emitting element LED4 will not change too much. When the first light-emitting element LED1 is open, the voltage across the first light-emitting element LED1 and the second light-emitting element LED2 rises. When the voltage across the first light-emitting element LED1 and the second light-emitting element LED2 rises to U', the first dummy light-emitting element LED1' connected in parallel with the first light-emitting element LED1 and the second light-emitting element LED2 is turned on, instead of the first light-emitting unit 21 to emit light. The voltage of the third light-emitting element LED3 and the fourth light-emitting element LED4 drops to (4U0−U')/2, and the second dummy light-emitting element LED2' is still in a high-resistance open circuit state. This ensures that when the first light-emitting element LED1 is disconnected, current can still flow into the third light-emitting element LED3 and the fourth light-emitting element LED4 through the first dummy light-emitting element LED1'. As a result, it is ensured that when one light-emitting element in the single partition 101 is disconnected, the other two light-emitting elements in the light-emitting unit connected in series with the light-emitting unit that is disconnected can still emit light normally.

Figure 8:
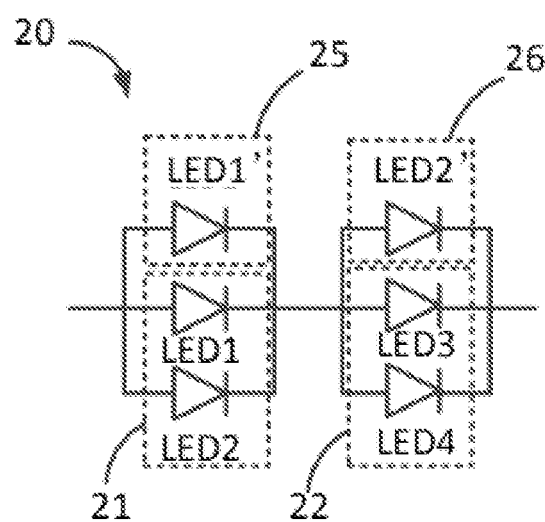
FIG. 8 is a circuit diagram of a light-emitting element of a light-emitting substrate according to a third embodiment of the present application.

Refer to FIG. 8, the light-emitting substrate 100 of the third embodiment of the present application is similar to the first embodiment, and the difference lies in:

The light-emitting element 20 includes a first light-emitting unit 21, a second light-emitting unit 22, a first dummy unit 25 and a second dummy unit 26. The first light-emitting unit 21 and the second light-emitting unit 22 are connected in series. The first dummy unit 25 is connected in parallel with the first light-emitting unit 21. The second dummy unit 26 is connected in parallel with the second light-emitting unit 22. The first light-emitting unit 21 includes a first light-emitting element LED1 and a second light-emitting element LED2. The second light-emitting unit 22 includes a third light-emitting element LED3 and a fourth light-emitting element LED4. The first light-emitting element LED1 and the second light-emitting element LED2 in the first light-emitting unit 21 are connected in parallel. The third light-emitting element LED3 and the fourth light-emitting element LED4 in the second light-emitting unit 22 are also connected in parallel. The first dummy unit 25 includes a first dummy light-emitting element LED1'. The second dummy unit 26 includes a second dummy light emitting element LED2'.

In the light-emitting substrate 100 of the third embodiment of the present application, the first light-emitting element LED1 and the second light-emitting element LED2 are connected in parallel, and both ends are connected in parallel with the first dummy light-emitting element LED1'. The third light-emitting element LED3 and the fourth light-emitting element LED4 are connected in parallel, and the two ends are connected in parallel with the second dummy light-emitting element LED2'. Its working principle is as follows:

Assuming that the operating voltages of the first light-emitting element LED1 to the fourth light-emitting element LED4 are all U0, the operating voltages of the first light-emitting unit 21 and the second light-emitting unit 22 are both U0. The operating voltages of the first dummy light-emitting element LED1' and the second dummy light-emitting element LED2' are both U'. When the light-emitting substrate 100 is working normally, the voltage applied to both ends of the light-emitting element 20 is 2U0. U' is greater than U0 to ensure that when the first light-emitting element LED1 to the fourth light-emitting element LED4 work normally, the first dummy light-emitting element LED1' and the second dummy light-emitting element LED2' are in a high-resistance disconnection state. U' can be close to U0, so as to ensure that when at least one of the first dummy light-emitting element LED1' and the second dummy light-emitting element LED2' is working, the partial voltage at both ends of the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to U', the first dummy light-emitting element LED1' connected in parallel with the first light-emitting element LED1 and the second light-emitting element LED2 is turned on, replacing the first light-emitting element LED1 to emit light. The voltage of the second light-emitting element LED2 rises to U', and the voltage of the third light-emitting element LED3 and the fourth light-emitting element LED4 drops to 2U0–U', The second dummy light-emitting element LED2' is still in a high-resistance open circuit state, therefore, it is ensured that when the first light-emitting element LED1 is disconnected, the current can still flow into the third light-emitting element LED3 and the fourth light-emitting element LED4 through the first dummy light-emitting element LED1' and the second light-emitting element LED2. This ensures that when one light-emitting element in the single partition 101 is disconnected, the first dummy light-emitting element LED1' can replace the first light-emitting element LED1 that is disconnected to emit light.

Figure 1B:
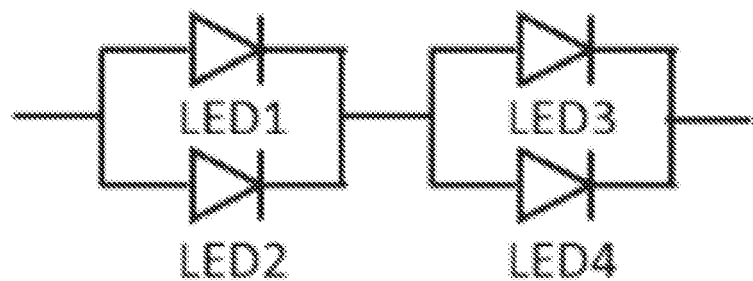
FIG. 1B is another circuit diagram of a light-emitting element in a light-emitting substrate in the prior art.

In addition, in the prior art as shown in FIG. 1B, if the first dummy unit 25 and the second dummy unit 26 are not provided, when the first light-emitting element LED1 is disconnected, the resistance of the first light-emitting unit 21 increases to the resistance of the second light-emitting element LED2. In this application, since the first dummy light-emitting element LED1' is connected in parallel, when the first light-emitting element LED1 is disconnected, a resistance of the first light-emitting unit 21 is increased to a parallel resistance of the second light-emitting element LED2 and the first dummy light-emitting element LED1'. Compared with the prior art, in the present application, when the first light-emitting element LED1 is disconnected, an increase in resistance of the first light-emitting unit 21 is small, and an increase in the partial voltage is also small, Therefore, the reduction in the partial voltage of the second light-emitting unit 22 connected in series with the first light-emitting unit 21 is also small, and the voltage change of each light-emitting unit in the light-emitting assembly 20 can be reduced, thereby reducing the change in brightness.

Figure 9:
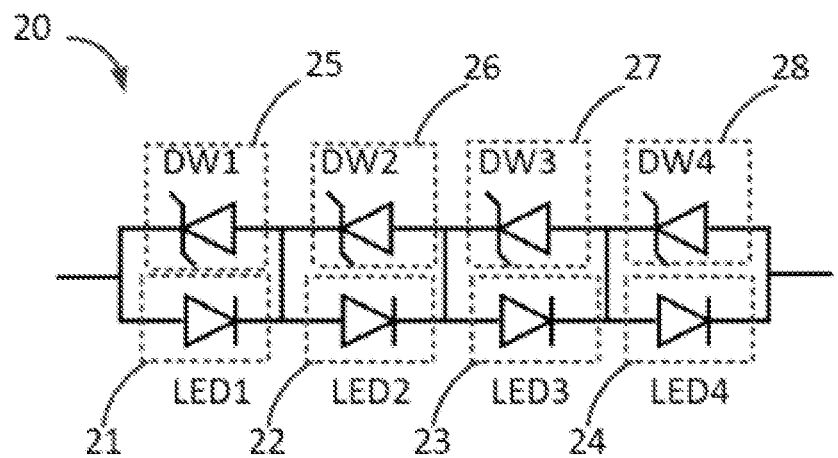
FIG. 9 is a circuit diagram of a light-emitting element of a light-emitting substrate according to a fourth embodiment of the present application.

Refer to FIG. 9, the light-emitting substrate 100 of the fourth embodiment of the present application is similar to the first embodiment, and the difference lies in:

The first dummy unit 25 to the fourth dummy unit 28 are all Zener diodes. Zener diode is a kind of crystal diode, which uses the characteristics of stable voltage in a breakdown area of a PN junction. The characteristic of the Zener diode is that after the PN junction is broken down, a voltage at both ends remains basically unchanged. The Zener diode is reversed in the circuit. Set an operating voltage of the Zener diode to Uz. When the voltage across the Zener diode is less than Uz, the Zener diode does not work and is in a high-resistance open circuit state. When the voltage across the Zener diode is greater than Uz, the Zener diode reversely breaks down and the voltage is maintained at Uz, thus achieving a voltage stabilizing effect.

In the light-emitting substrate 100 of the first embodiment of the present application, both ends of the first light-emitting element LED1, the second light-emitting element LED2, the third light-emitting element LED3, and the fourth light-emitting element LED4 are connected in parallel with a first Zener diode DW1, a second Zener diode DW2, a third Zener diode DW3, and a fourth Zener diode DW4, respectively. Its working principle is as follows:

Assuming that the operating voltages of the first light-emitting element LED1 to the fourth light-emitting element LED4 are all U0, the operating voltages of the first light-emitting unit 21 and the second light-emitting unit 22 are both U0. The operating voltages of the first Zener diode DW1 to the fourth Zener diode DW4 are Uz. When the light-emitting substrate 100 is working normally, the voltage applied to both ends of the light-emitting assembly 20 is 4U0. Uz is greater than U0 to ensure that when the first light-emitting element LED1 to the fourth light-emitting element LED4 work normally, the first Zener diode DW1 to the fourth Zener diode DW4 are in a high-resistance open circuit state. Uz can be close to U0, so as to ensure that when at least one of the first zener diode DW1 to the fourth zener diode DW4 is working, the divided voltage across the first light-emitting element LED1 to the fourth light-emitting element LED4 will not change too much. When the first light-emitting element LED1 is open, the voltage across the first light-emitting element LED1 rises. When the voltage across the first light-emitting element LED1 rises to Uz, the first Zener diode DW1 connected in parallel with the first light-emitting element LED1 is turned on. The voltage across the second light-emitting element LED2, the third light-emitting element LED3, and the fourth light-emitting element LED4 drops to (4U0–Uz)/3. The second zener diode DW2, the third zener diode DW3, and the fourth zener diode DW4 are still in a high-resistance open circuit state, and this ensures that when the first light-emitting element LED1 is disconnected, current can still flow into the second light-emitting element LED2, the third light-emitting element LED3, and the fourth light-emitting element LED4 through the first zener diode DW1. Thus, it is ensured that when one light-emitting element in the single partition 101 of the light-emitting substrate 100 is disconnected, the three light-emitting elements in the other light-emitting units connected in series with the light-emitting unit that is disconnected can still emit light normally.

Figure 10:
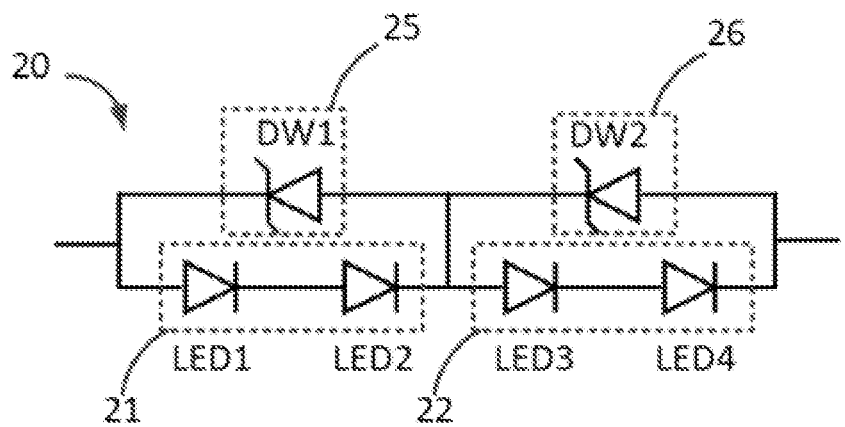
FIG. 10 is a circuit diagram of a light-emitting element of a light-emitting substrate according to a fifth embodiment of the present application.

Refer to FIG. 10, the light-emitting substrate 100 of the fifth embodiment of the present application is similar to the second embodiment, and the difference lies in:

The first dummy unit 25 and the second dummy unit 26 are both Zener diodes.

In the light-emitting substrate 100 of the fifth embodiment of the present application, the first light-emitting element LED1 and the second light-emitting element LED2 are connected in series, and the first zener diode DW1 is connected in parallel at both ends. The third light-emitting element LED3 and the fourth light-emitting element LED4 are connected in series, and the second Zener diode DW2 is connected in parallel at both ends. Its working principle is as follows:

Assuming that the operating voltages of the first light-emitting element LED1 to the fourth light-emitting element LED4 are U0, the operating voltages of the first light-emitting unit 21 and the second light-emitting unit 22 are both 2*U0. The operating voltages of the first zener diode DW1 and the second zener diode DW2 are both Uz. When the light-emitting substrate 100 is working normally, the voltage applied to both ends of the light-emitting assembly 20 is 4U0. Uz is greater than 2*U0 to ensure that when the first light-emitting element LED1 to the fourth light-emitting element LED4 work normally, the first Zener diode DW1 and the second Zener diode DW2 are in a high-resistance open circuit state. Uz can be close to 2*U0, so as to ensure that when at least one of the first zener diode DW1 and the second zener diode DW2 is working, the partial voltage across the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to Uz, the first Zener diode DW1 connected in parallel with the first light-emitting element LED1 and the second light-emitting element LED2 is turned on. The voltage of the third light-emitting element LED3 and the fourth light-emitting element LED4 drops to (4U0−Uz)/2, and the second Zener diode DW2 is still in a high-resistance open circuit state. This ensures that when the first light-emitting element LED1 is disconnected, current can still flow into the third light-emitting element LED3 and the fourth light-emitting element LED4 through the first Zener diode DW1. Therefore, it is ensured that when one light-emitting element in the single partition 101 is disconnected, the two light-emitting elements in the other light-emitting units connected in series with the light-emitting unit that is disconnected can still emit light normally.

Figure 11:
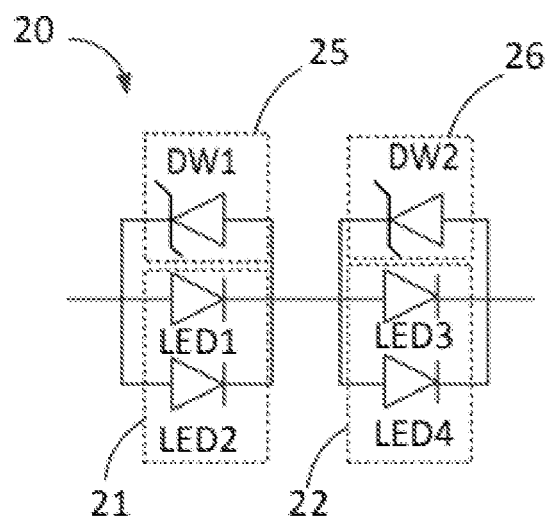
FIG. 11 is a circuit diagram of a light-emitting element of a light-emitting substrate according to a sixth embodiment of the present application.

Refer to FIG. 11, the light-emitting substrate 100 of the sixth embodiment of the present application is similar to the third embodiment, and the difference lies in:

The first dummy unit 25 and the second dummy unit 26 are both Zener diodes.

In the light-emitting substrate 100 according to the sixth embodiment of the present application, the first light-emitting element LED1 and the second light-emitting element LED2 are connected in parallel, and the first zener diode DW1 is connected in parallel at both ends. The third light-emitting element LED3 and the fourth light-emitting element LED4 are connected in parallel, and the second zener diode DW2 is connected in parallel at both ends. Its working principle is as follows:

Assuming that the operating voltages of the first light-emitting element LED1 to the fourth light-emitting element LED4 are all U0, the operating voltages of the first light-emitting unit 21 and the second light-emitting unit 22 are both U0. The operating voltages of the first zener diode DW1 and the second zener diode DW2 are both Uz. When the light-emitting substrate 100 is working normally, the voltage applied to both ends of the light-emitting element 20 is 2U0. Uz is greater than U0 to ensure that when the first light-emitting element LED1 to the fourth light-emitting element LED4 work normally, the first voltage regulator tube and the second voltage regulator tube are in a high-resistance open circuit state. Uz can be close to U0, so as to ensure that when at least one of the first zener diode DW1 and the second zener diode DW2 is working, the divided voltage across the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to Uz, the first Zener diode DW1 connected in parallel with the first light-emitting element LED1 and the second light-emitting element LED2 is turned on. The voltage of the second light-emitting element LED2 rises to Uz, the voltage of the third light-emitting element LED3 and the fourth light-emitting element LED4 drops to 2U0−Uz, and the second Zener diode DW2 is still in a high-resistance open circuit state. This ensures that when the first light-emitting element LED1 is disconnected, current can still flow into the third light-emitting element LED3 and the fourth light-emitting element LED4 through the first zener diode DW1 and the second light-emitting element LED2. This ensures that when all the light-emitting elements in one light-emitting unit in the single zone 101 are disconnected, the light-emitting elements connected in parallel with the light-emitting unit that has the disconnection can still emit light normally.

In the prior art as shown in FIG. 1B, if the first dummy unit 25 and the second dummy unit 26 are not provided, when the first light-emitting element LED1 is disconnected, the resistance of the first light-emitting unit 21 increases to the resistance of the second light-emitting element LED2. In this application, because the first Zener diode DW1 is connected in parallel, when the first light-emitting element LED1 is disconnected, the resistance of the first light-emitting unit 21 increases to the parallel resistance of the second light-emitting element LED2 and the first Zener diode DW1. Compared with the prior art, in the present application, when the first light-emitting element LED1 is disconnected, an increase in resistance of the first light-emitting unit 21 is small, and an increase in the partial voltage is also small, therefore, a decrease in the partial pressure of the second light-emitting unit 22 connected in series with the first light-emitting unit 21 is also small. The voltage change of each light-emitting unit in the light-emitting element 20 can be reduced, thereby reducing the change in brightness.

Figure 12:
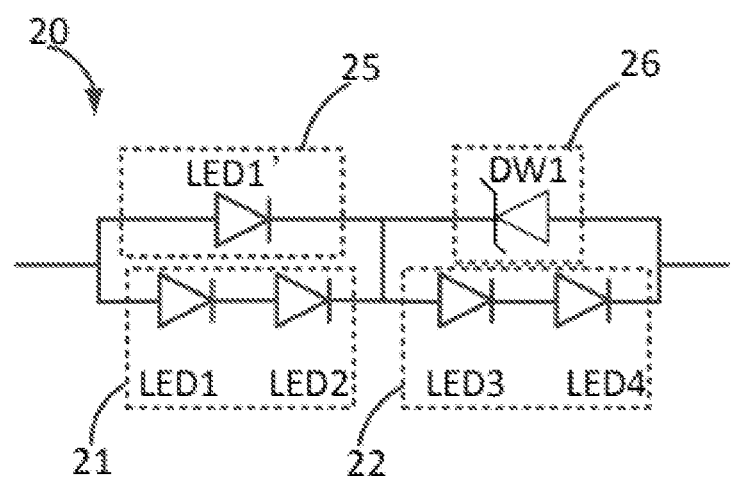
FIG. 12 is a circuit diagram of a light-emitting element of a light-emitting substrate according to a seventh embodiment of the present application.

Refer to FIG. 12, the light-emitting substrate 100 of the seventh embodiment of the present application is similar to the second embodiment, and the difference lies in:

The first dummy unit 25 is the first dummy light-emitting element LED1'. The second dummy unit 26 is the first Zener diode DW1. The dummy light-emitting element used in the first dummy light-emitting unit 25 may be the same device as the light-emitting elements used in the first light-emitting unit 21 and the second light-emitting unit 22. In this embodiment, the first light-emitting element LED1, the second light-emitting element LED2, and the first dummy unit 25 are all Mini-LEDs.

In the light-emitting substrate 100 of the seventh embodiment of the present application, the first light-emitting element LED1 and the second light-emitting element LED2 are connected in series, and both ends are connected in parallel with the first dummy light-emitting element LED1'. The third light-emitting element LED3 and the fourth light-emitting element LED4 are connected in parallel, and the first Zener diode DW1 is connected in parallel at both ends. Its working principle is as follows:

Assuming that the operating voltages of the first light-emitting element LED1 to the fourth light-emitting element LED4 are U0, the operating voltages of the first light-emitting unit 21 and the second light-emitting unit 22 are both 2*U0. The operating voltage of the first dummy light-emitting element LED1' is U', and the operating voltage of the first Zener diode DW1 is Uz. When the light-emitting substrate 100 is working normally, the voltage applied to both ends of the light-emitting element 20 is 4U0. U' and Uz are greater than 2*U0 to ensure that when the first light-emitting element LED1 to the fourth light-emitting element LED4 work normally, the first dummy light-emitting element LED1' and the first Zener diode DW1 are in a high-resistance open circuit state. U' and Uz can be close to 2*U0, so as to ensure that at least one of the first dummy light-emitting element LED1' and the first Zener diode DW1 is working, the partial pressures at both ends of the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to U', the first dummy light-emitting element LED1' connected in parallel with the first light-emitting element LED1 and the second light-emitting element LED2 is turned on, instead of the first light-emitting unit 21 to emit light. The voltage of the third light-emitting element LED3 and the fourth light-emitting element LED4 drops to (4U0–U')/2, the second dummy light-emitting element LED2' is still in a high-resistance open circuit state. This ensures that when the first light-emitting element LED1 is disconnected, current can still flow into the third light-emitting element LED3 and the fourth light-emitting element LED4 through the first dummy light-emitting element LED1'. Therefore, it is ensured that when one light-emitting element in the first light-emitting unit 21 in the single zone 101 is disconnected, the other two light-emitting elements in the light-emitting unit connected in series with the light-emitting unit that is disconnected can still emit light normally.

When the third light-emitting element LED3 is open, the voltage across the third light-emitting element LED3 and the fourth light-emitting element LED4 increases. When the voltage across the third light-emitting element LED3 and the fourth light-emitting element LED4 rises to Uz, the first Zener diode DW1 connected in parallel with the third light-emitting element LED3 and the fourth light-emitting element LED4 is turned on. The voltage of the first light-emitting element LED1 and the second light-emitting element LED2 drops to (4U0–Uz)/2, and the first dummy light-emitting element LED1' is still in a high-resistance open circuit state. This ensures that when the third light-emitting element LED3 is disconnected, current can still flow into the first light-emitting element LED1 and the second light-emitting element LED2 through the first Zener diode DW1. This ensures that when all the light-emitting elements in the second light-emitting unit in the single zone 101 are disconnected, two light-emitting elements in the other light-emitting units connected in series with the light-emitting unit that is disconnected can still emit light normally. In addition, as in the third embodiment, it is also possible to reduce the voltage variation of each light-emitting unit in the light-emitting element 20, thereby reducing the brightness variation.

Figure 13:
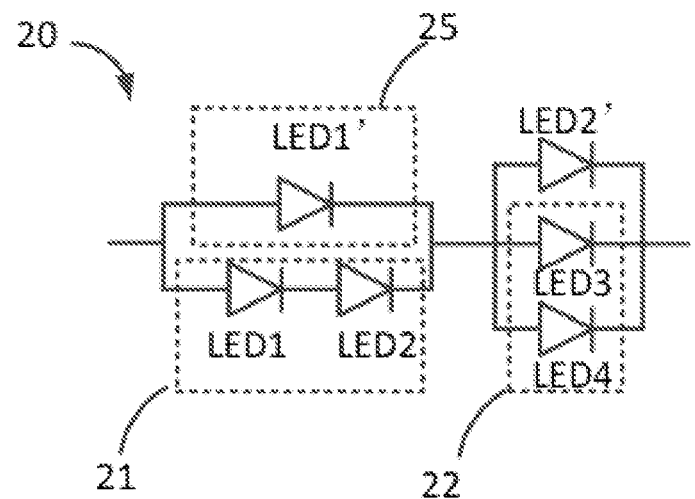
FIG. 13 is a circuit diagram of a light-emitting element of a light-emitting substrate according to an eighth embodiment of the present application.

Refer to FIG. 13, the light-emitting substrate 100 of the eighth embodiment of the present application is similar to the second embodiment, but the difference lies in:

The first light-emitting element LED1 and the second light-emitting element LED2 in the first light-emitting unit 21 are connected in series. The third light-emitting element LED3 and the fourth light-emitting element LED4 in the second light-emitting unit 22 are connected in parallel.

In the light-emitting substrate 100 of the second embodiment of the present application, the first light-emitting element LED1 and the second light-emitting element LED2 are connected in series, and both ends are connected in parallel with the first dummy light-emitting element LED1'. The third light-emitting element LED3 and the fourth light-emitting element LED4 are connected in series, and the second dummy light-emitting element LED2' is connected in parallel at both ends. The working principle can be referred to the second embodiment and the third embodiment, and detailed description is omitted here.

Figure 14:
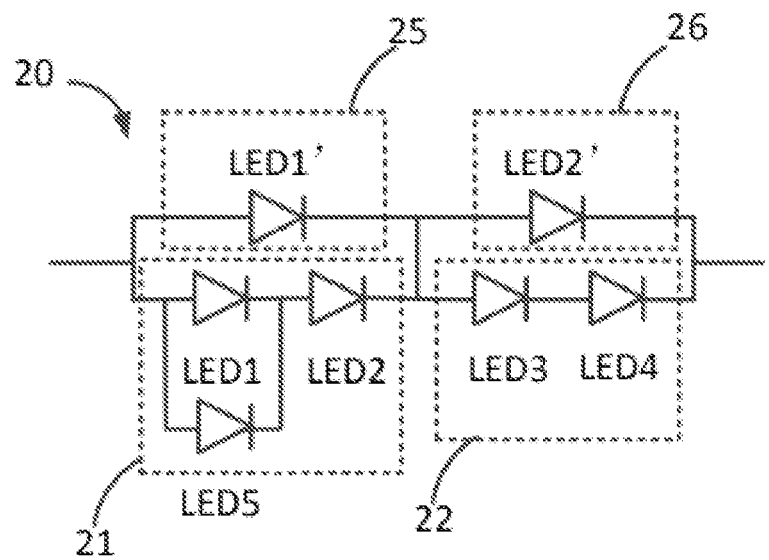
FIG. 14 is a circuit diagram of a light-emitting element of a light-emitting substrate according to a ninth embodiment of the present application.

Refer to FIG. 14, the light-emitting substrate 100 of the ninth embodiment of the present application is similar to the second embodiment, and the difference lies in:

The first light-emitting unit 21 further includes a fifth light-emitting element LED5, which is connected in parallel with the first light-emitting element LED1, and then connected in series with the second light-emitting element LED2. The working principle can be referred to the second embodiment, and detailed description is omitted here.

Figure 15:
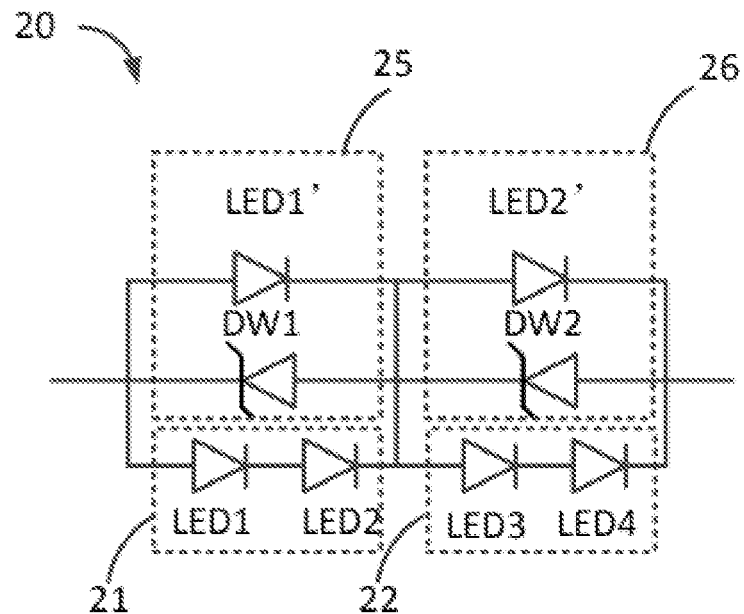
FIG. 15 is a circuit diagram of a light-emitting element of a light-emitting substrate according to a tenth embodiment of the present application.

Refer to FIG. 15, the light-emitting substrate 100 of the tenth embodiment of the present application is similar to the second embodiment, and the difference lies in:

The first dummy unit 25 also includes a first Zener diode DW1, and the first Zener diode DW1 is connected in parallel with the first dummy light-emitting unit LED1'. The second dummy unit 26 also includes a second Zener diode DW2, and the second Zener diode DW2 is connected in parallel with the second dummy light-emitting unit LED2'. After the Zener diode reversely breaks down, the voltage at both ends will remain stable. If the operating voltage of the first Zener diode DW1 is less than the operating voltage of the first dummy light-emitting unit LED1', after the first Zener diode DW1 is reversely broken down, the voltage at both ends will no longer rise, and the first dummy light-emitting unit LED1' cannot be lighted. Optionally, the operating voltage of the first Zener diode DW1 is greater than or equal to the operating voltage of the first dummy light-emitting unit LED1'. Further, the operating voltage of the first Zener diode DW1 and the first dummy light-emitting unit LED1' is 105% to 150% of the operating voltage of the first light-emitting unit 21. The operating voltage of the second Zener diode DW2 is greater than or equal to the operating voltage of the second dummy light-emitting unit LED2', and the operating voltage of the second dummy light-emitting unit LED2' is greater than the operating voltage of the second light-emitting element LED2. Optionally, the operating voltage of the second Zener diode DW2 and the first dummy light-emitting unit LED1' is 105% to 150% of the operating voltage of the second light-emitting unit 22.

In the light-emitting substrate 100 of the tenth embodiment of the present application, the first light-emitting element LED1 and the second light-emitting element LED2 are connected in series, and the first dummy light-emitting element LED1' and the first Zener diode DW1 are connected in parallel at both ends. The third light-emitting element LED3 and the fourth light-emitting element LED4 are connected in series, and the second dummy light-emitting element LED2' and the second Zener diode DW2 are connected in parallel at both ends. Its working principle is as follows:

Assuming that the operating voltages of the first light-emitting element LED1 to the fourth light-emitting element LED4 are U0, the operating voltages of the first light-emitting unit 21 and the second light-emitting unit 22 are both 2*U0. The operating voltages of the first dummy light-emitting element LED1' and the second dummy light-emitting element LED2' are both U'. The operating voltages of the first Zener diode DW1 and the second Zener diode DW2 are both Uz. Uz=U'. When the light-emitting substrate 100 is working normally, the voltage applied to both ends of the light-emitting element 20 is 4U0. U' is greater than 2*U0 to ensure that when the first light-emitting element LED1 to the fourth light-emitting element LED4 work normally, the first dummy light-emitting element LED1' to the fourth dummy light-emitting element LED4' are in a high-resistance open circuit state. U' can be close to 2*U0, so as to ensure that when at least one of the first dummy light-emitting element LED1' to the second dummy light-emitting element LED2' is working, the partial voltages at both ends of the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to Uz, the first dummy light-emitting element LED1' connected in parallel with the first light-emitting element LED1 and the second light-emitting element LED2 and the first zener diode DW1 are turned on, instead of the first light-emitting unit 21 to emit light and conduct the circuit. Due to the stabilizing effect of the first Zener diode DW1, the voltage across the first dummy light-emitting element LED1' can be ensured to be stable, thereby ensuring the stability of the luminous brightness. The voltages of the third light-emitting element LED3 and the fourth light-emitting element LED4 drop to (4U0−Uz)/2, and the second dummy light-emitting element LED2' and the second Zener diode DW2 are still in a high-resistance open circuit state. This ensures that when the first light-emitting element LED1 is disconnected, current can still flow into the third light-emitting element LED3 and the fourth light-emitting element LED4 through the first dummy light-emitting element LED1'. Therefore, it is ensured that when one light-emitting element in the single partition 101 is disconnected, the other two light-emitting elements in the light-emitting unit connected in series with the light-emitting unit that is disconnected can still emit light normally and stably.

Figure 16:
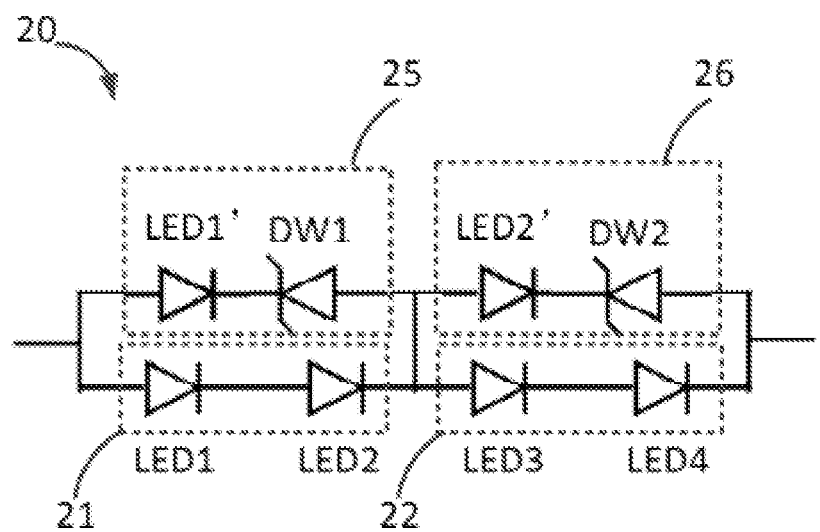
FIG. 16 is a circuit diagram of a light-emitting element of a light-emitting substrate according to an eleventh embodiment of the present application.

Refer to FIG. 16, the light-emitting substrate 100 of the eleventh embodiment of the present application is similar to the second embodiment, and the difference lies in:

The first dummy unit 25 also includes a first Zener diode DW1, and the first Zener diode DW1 is connected in series with the first dummy light-emitting unit LED1'. The second dummy unit 26 also includes a second Zener diode DW2, and the second Zener diode DW2 is connected in series with the second dummy light-emitting unit LED2'. The operating voltage of the first dummy light-emitting unit LED1' is greater than the operating voltage of the first light-emitting element LED1. After the Zener diode reversely breaks down, the voltage at both ends will remain stable. If the operating voltage of the first Zener diode DW1 is less than the operating voltage of the first dummy light-emitting unit LED1', after the first Zener diode DW1 is reversely broken down, the voltage at both ends will no longer rise, and the first dummy light-emitting unit LED1' cannot be lighted. Optionally, the operating voltage of the first Zener diode DW1 is greater than or equal to the operating voltage of the first dummy light-emitting unit LED1'. Further, the sum of the operating voltage of the first Zener diode DW1 and the first dummy light-emitting unit LED1' is 105% to 150% of the operating voltage of the first light-emitting unit 21. The operating voltage of the second Zener diode DW2 is greater than or equal to the operating voltage of the second dummy light-emitting unit LED2', and the operating voltage of the second dummy light-emitting unit LED2' is greater than the operating voltage of the second light-emitting element LED2. Optionally, the sum of the operating voltage of the second Zener diode DW2 and the first dummy light-emitting unit LED1' is 105% to 150% of the operating voltage of the second light-emitting unit 22.

In the light-emitting substrate 100 of the eleventh embodiment of the present application, the first light-emitting element LED1 and the second light-emitting element LED2 are connected in series, and the first dummy light-emitting element LED1' and the first Zener diode DW1 are connected in parallel at both ends. The third light-emitting element LED3 and the fourth light-emitting element LED4 are connected in series, and the second dummy light-emitting element LED2' and the second Zener diode DW2 are connected in parallel at both ends. Its working principle is as follows:

Assuming that the operating voltages of the first light-emitting element LED1 to the fourth light-emitting element LED4 are U0, the operating voltages of the first light-emitting unit 21 and the second light-emitting unit 22 are both 2*U0. The operating voltages of the first dummy light-emitting element LED1' and the second dummy light-emitting element LED2' are both U'. The operating voltages of the first Zener diode DW1 and the second Zener diode DW2 are both Uz. Uz=U'. When the light-emitting substrate 100 is working normally, the voltage applied to both ends of the light-emitting element 20 is 4U0. The sum of U' and Uz is greater than 2*U0 to ensure that when the first light-emitting element LED1 to the fourth light-emitting element LED4 work normally, the first dummy light-emitting element LED1' to the fourth dummy light-emitting element LED4' are in a high-resistance open circuit state. The sum of U' and Uz can be close to 2*U0, so as to ensure that when at least one of the first dummy light-emitting element LED1' to the second dummy light-emitting element LED2' is working, the partial voltages at both ends of the first light-emitting element LED1 to the fourth light-emitting element LED4 will not change too much. When the first light-emitting element LED1 is open, the voltage across the first light-emitting element LED1 and the second light-emitting element LED2 increases. When the voltage across the first light-emitting element LED1 and the second light-emitting element LED2 rises to Uz, the first dummy light-emitting element LED1' connected in series with the first light-emitting element LED1 and the second light-emitting element LED2 and the first Zener diode DW1 are turned on, instead of the first light-emitting unit 21 to emit light and conduct the circuit. Due to the stabilizing effect of the first Zener diode DW1, the voltage across the first dummy light-emitting element LED1' can be ensured to be stable, thereby ensuring the stability of the luminous brightness. The voltage of the third light-emitting element LED3 and the fourth light-emitting element LED4 drops to (4U0−U'−Uz)/2, and the second dummy light-emitting element LED2' and the second Zener diode DW2 are still in a high-resistance disconnected state. This ensures that when the first light-emitting element LED1 is disconnected, current can still flow into the third light-emitting element LED3 and the fourth light-emitting element LED4 through the first dummy light-emitting element LED1'. Therefore, it is ensured that when one light-emitting element in the single partition 101 is disconnected, the other two light-emitting elements in the light-emitting unit connected in series with the light-emitting unit that is disconnected can still emit light normally and stably.

Figure 17:
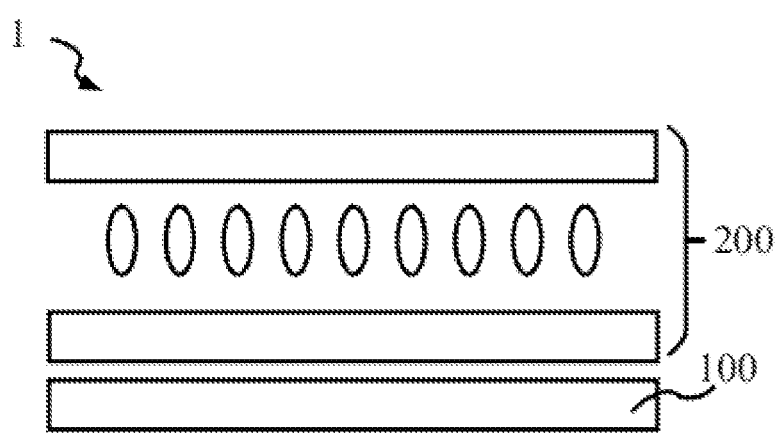
FIG. 17 is a schematic diagram of a structure of a display device of the present application.

Refer to FIG. 17, this application also provides a display device 1. The display device 1 may be an electronic device with a display function such as a mobile phone, a tablet computer, a notebook, a game machine, an electronic billboard, an automatic teller machine, and the like. The display device 1 may be a liquid crystal display device. The display device 1 includes a liquid crystal display panel 200 and the light-emitting substrate 100 of the present application. It can be understood that the liquid crystal display device also includes upper and lower polarizers, cover plates and other components. It can be understood that in other embodiments of the present application, the display device 1 may also be a self-luminous display device.

By using the light-emitting substrate 100 provided in the present application, the display device 1 can prevent the entire circuit from being disconnected due to the disconnection of the first light-emitting unit or excessive voltage division of the first light-emitting unit, resulting in excessive brightness changes.

At least one partition of a light-emitting substrate of the present application is provided with a first light-emitting unit and a first dummy unit connected in parallel, and the first dummy unit includes a dummy light-emitting element. When the light-emitting element in the first light-emitting unit fails, causing the first light-emitting unit to be disconnected, a voltage across the first light-emitting unit and the first dummy unit rises. When the voltage across the first light-emitting unit and the first dummy unit rises to an operating voltage of the first dummy unit, the dummy light-emitting element is turned on, instead of the light-emitting element that is disconnected in the first light-emitting unit, emits light and conducts the circuit, thereby preventing dark lights or loss of brightness caused when the light-emitting element in a single partition is disconnected.

According to an embodiment of the present application, the operating voltage of the first dummy unit is 105% to 130% of the operating voltage of the first light-emitting unit. That is, the operating voltage of the first dummy unit is close to the operating voltage of the first light-emitting unit. This can prevent excessive changes in the brightness of the light-emitting element caused by the excessive working voltage difference between the first dummy unit and the first light-emitting unit.

The above provides a detailed introduction to the implementation of the present application, specific examples are used in this article to describe the principles and implementations of the present application, and the description of the implementations above is only used to help understand the present application. In addition, for those skilled in the art, according to the idea of the present application, there will be changes in the specific implementation and the scope of the present application. In summary, the content of this specification should not be construed as a limitation to the present application.

What is claimed is:

1. A light-emitting substrate comprising a plurality of partitions, wherein the partitions comprise:
   a first light-emitting unit comprising at least one light-emitting element; and
   a first dummy unit connected in parallel with the first light-emitting unit, wherein the first dummy unit comprises a dummy light-emitting element, and an operating voltage of the first dummy unit is greater than an operating voltage of the first light-emitting unit;
   wherein the operating voltage of the first dummy unit is 105% to 150% of the operating voltage of the first light-emitting unit.

2. The light-emitting substrate according to claim 1, wherein the operating voltage of the first dummy unit is 105% to 130% of the operating voltage of the first light-emitting unit.

3. The light-emitting substrate according to claim 2, wherein the light-emitting substrate further comprises an optical film, and the optical film is disposed on a light-emitting side of the first light-emitting unit and the first dummy unit.

4. The light-emitting substrate according to claim 1, wherein the first light-emitting unit comprises two or more light-emitting elements, and two or more of the light-emitting elements are arranged in series, in parallel, or in a combination of series and parallel.

5. The light-emitting substrate according to claim 1, wherein the first light-emitting unit and the first dummy unit are integrated in a same chip.

6. The light-emitting substrate according to claim 1, wherein the partition further comprises:
   a second light-emitting unit connected in series with the first light-emitting unit, wherein the second light-emitting unit comprises at least one light-emitting element; and
   a second dummy unit connected in parallel with the second light-emitting unit, wherein an operating voltage of the second dummy unit is greater than an operating voltage of the second light-emitting unit.

7. The light-emitting substrate according to claim 6, wherein the second dummy unit comprises a dummy light-emitting element and/or a Zener diode.

8. The light-emitting substrate according to claim 6, wherein the first dummy unit and the second dummy unit are composed of light-emitting elements, and the light-emitting elements in the first light-emitting unit, the second light-emitting unit, the first dummy unit, and the second dummy unit are the same device.

9. The light-emitting substrate according to claim 1, wherein the first dummy unit further comprises a Zener diode, and the Zener diode is connected in series or in parallel with the dummy light-emitting element.

10. The light-emitting substrate according to claim 9, wherein an operating voltage of the Zener diode is greater than the operating voltage of the dummy light-emitting element.

11. A display device comprising a light-emitting substrate, the light-emitting substrate comprising a plurality of partitions, wherein the partitions comprise:
a first light-emitting unit comprising at least one light-emitting element; and
a first dummy unit connected in parallel with the first light-emitting unit, wherein the first dummy unit comprises a dummy light-emitting element, and an operating voltage of the first dummy unit is greater than an operating voltage of the first light-emitting unit;
wherein the operating voltage of the first dummy unit is 105% to 150% of the operating voltage of the first light-emitting unit.

12. The display device according to claim 11, wherein the display device is a liquid crystal display device or a self-luminous display device.

13. The display device according to claim 11, wherein the operating voltage of the first dummy unit is 105% to 130% of the operating voltage of the first light-emitting unit.

14. The display device according to claim 13, wherein the light-emitting substrate further comprises an optical film, and the optical film is disposed on a light-emitting side of the first light-emitting unit and the first dummy unit.

15. The display device according to claim 11, wherein the first light-emitting unit comprises two or more light-emitting elements, and two or more of the light-emitting elements are arranged in series, in parallel, or in a combination of series and parallel.

16. The display device according to claim 11, wherein the first light-emitting unit and the first dummy unit are integrated in a same chip.

17. The display device according to claim 11, wherein the partition further comprises:

a second light-emitting unit connected in series with the first light-emitting unit, wherein the second light-emitting unit comprises at least one light-emitting element; and
a second dummy unit connected in parallel with the second light-emitting unit, wherein an operating voltage of the second dummy unit is greater than an operating voltage of the second light-emitting unit.

18. The light-emitting substrate according to claim 17, wherein the first dummy unit and the second dummy unit are composed of light-emitting elements, and the light-emitting elements in the first light-emitting unit, the second light-emitting unit, the first dummy unit, and the second dummy unit are the same device.

19. A light-emitting substrate comprising a plurality of partitions, wherein the partitions comprise:
a first light-emitting unit comprising at least one light-emitting element; and
a first dummy unit connected in parallel with the first light-emitting unit, wherein the first dummy unit comprises a dummy light-emitting element, and an operating voltage of the first dummy unit is greater than an operating voltage of the first light-emitting unit;
wherein the first dummy unit further comprises a Zener diode, and the Zener diode is connected in series or in parallel with the dummy light-emitting element.

20. The light-emitting substrate according to claim 19, wherein an operating voltage of the Zener diode is greater than the operating voltage of the dummy light-emitting element.

* * * * *